United States Patent
Shimizu

[19]

[11] Patent Number: 6,085,348
[45] Date of Patent: *Jul. 4, 2000

[54] ERROR CORRECTION CODE ENCODER AND DECODER

[75] Inventor: Tetsuya Shimizu, Yokohama, Japan

[73] Assignee: Canon Kabushiki Kaisha, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/227,694

[22] Filed: Apr. 14, 1994

Related U.S. Application Data

[63] Continuation of application No. 07/777,159, Oct. 16, 1991, abandoned.

[30] Foreign Application Priority Data

Oct. 17, 1990 [JP] Japan .................................. 2-279714

[51] Int. Cl.[7] .................................................. H03N 13/00
[52] U.S. Cl. .......................................................... 714/755
[58] Field of Search ............................... 371/37.4, 37.1, 371/37.7, 40.1, 37.01, 37.8, 38.1, 39.1, 40.11, 40.2; 364/265, 265.1, 265.2, 943.9, 242.8; 714/755, 752, 758, 763, 759, 761, 762, 764

[56] References Cited

U.S. PATENT DOCUMENTS

| | | | |
|---|---|---|---|
| 4,425,644 | 1/1984 | Scholz | 371/37.7 |
| 4,583,225 | 4/1986 | Yamada et al. | 371/37.4 |
| 4,630,272 | 12/1986 | Fukami et al. | 371/37.4 |
| 4,719,628 | 1/1988 | Ozaki et al. | 371/37.4 |
| 4,779,276 | 10/1988 | Kashida et al. | 371/37.08 |
| 4,882,732 | 11/1989 | Kaminaga | 371/37.4 |
| 4,972,416 | 11/1990 | Nagai et al. | 371/37.4 |
| 5,159,452 | 10/1992 | Kiroshita et al. | 371/38.1 |
| 5,212,695 | 5/1993 | Shikakura et al. | 371/37.8 |
| 5,220,568 | 6/1993 | Howe et al. | 371/37.08 |

FOREIGN PATENT DOCUMENTS

| | | |
|---|---|---|
| 0042121 | 12/1981 | European Pat. Off. . |
| 0191410 | 8/1986 | European Pat. Off. . |
| 0341851 | 11/1989 | European Pat. Off. . |
| 1-228382 | 9/1989 | Japan . |
| 2065416 | 6/1981 | United Kingdom . |

*Primary Examiner*—Trinh L. Tu
*Attorney, Agent, or Firm*—Fitzpatrick, Cella, Harper & Scinto

[57] ABSTRACT

Error correction code (ECC) encoding is performed by using a first ECC encoding means to add a first check code to each of a number of first code groups included in a code sequence. Additionally, a second ECC encoding means is employed to add a second check code to each of a number of second code groups. The second check code is extracted from a predetermined number of successive first code groups in the code sequence.

16 Claims, 7 Drawing Sheets

LINE 1
LINE 2
LINE 3

LINE 525

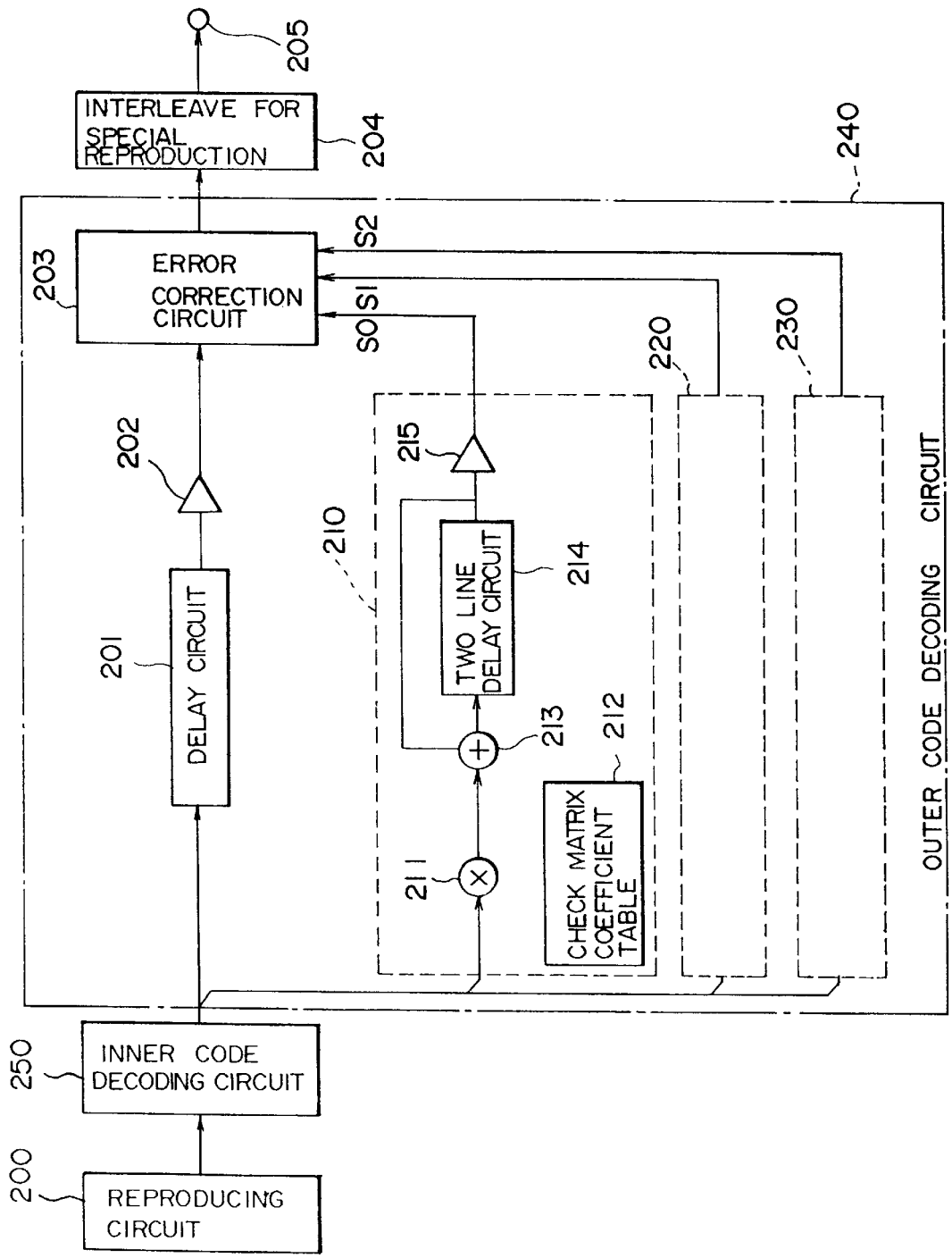

6,085,348

ERROR CORRECTION CODE ENCODER AND DECODER

This application is a continuation, of application Ser. No. 07/777,159 filed Oct. 16, 1991, now abandoned.

BACKGROUND OF THE INVENTION

1. Field of the Invention

The present invention relates to an error correction code encoder and decoder, and more particularly to an encoder and decoder using a so-called product code as an error correction code in a system which transmits a code train via a transmission path such as a magnetic recording/reproducing path which may sometimes generate burst errors.

2. Related Background Art

It is known that a so-called interleave method is used to improve an error correction capability of a system having a transmission path such as a magnetic recording/reproducing path which may sometimes generate burst errors. With this interleave method, data after being subject to error correction code encoding and constituting the same encoded block or same error correction code, is distributedly sent to a transmission line.

Such an interleave method used by a video VTR will be described by way of example.

FIG. 1 is a diagram used for explaining a video signal processed by a digital VTR. In FIG. 1, there are shown horizontal scan lines including the first, second, . . . , 525-th line. In this example, a video signal having 525 horizontal scan lines such as an NTSC signal is used.

In VTR, digital video signals of one frame are divided into a predetermined number (P) of blocks. Each block is subject to error correction code encoding, and written in one track. Thus, P tracks are used for recording video signals of one frame.

FIG. 2 is a diagram illustrating error correction code encoded blocks. As shown in FIG. 2, information data (information words) $I_{11}$ to $I_{ki}$ is encoded, for example by using such as Reed Solomon codes to provide inner codes in the horizontal direction and outer codes in the vertical direction, i.e., provide so-called product codes. In this example, it is assumed that inner and outer codes include three parity words (check bits) $IP_{11}$ to $Ip_{m3}$, and $OP_{11}$ to $OP_{3k}$, respectively, and that each code can correct one word error.

The order of recording data (order of data transmission) in a magnetic tape is the same as the direction of inner code encoding, i.e., in the order of $I_{11}, I_{12}, I_{13}, \ldots, I_{1i}, IP_{11}, IP_{12}, IP_{13}, I_{21}, I_{22}, \ldots$ . Therefore, burst errors caused by dropout, scratches or stains on a magnetic tape during a reproducing operation are consecutive in the inner code encoding direction.

As described above, if each outer or inner code can correct one word, burst errors of maximum one line or i words can be corrected by outer codes, but burst errors more than this cannot be corrected.

In order to improve the error correction capability, data is encoded for each block. The encoded data is exchanged between blocks to record mixed data of a plurality of blocks in one track. For example, in a simple case, data of two blocks is exchanged on the line unit basis. With such an arrangement, even if burst errors more than one line occur, burst errors of a maximum of two lines can be corrected using outer codes because the reproducing process can be performed one line per each block. However, in this case, two tracks for the unit interleave process should not contain other burst errors or random errors. It can be said therefore that the above-described interleave method is very effective for improving the error correction capability without having a large redundancy if occurrence frequency of burst errors is fairly low.

FIG. 3 is a block diagram showing the brief arrangement of a conventional digital VTR which uses the interleave method.

Information data inputted from an input terminal 300 is encoded on a block unit basis by an outer code encoding circuit 301 and an inner code encoding circuit 302. The data is exchanged or interleaved in line units or word units with an interleave circuit 303 by using a memory. The interleave circuit 303 sequentially outputs data of a plurality of blocks to a recording circuit 304 which processes the data for magnetically recording it on a magnetic tape (recording medium) 310 serving as a transmission path.

A signal picked up from the magnetic tape 310 is supplied to a reproducing circuit 305 to reproduce data. The reproduced data is processed by another interleave circuit 306, in a manner opposite to the interleave circuit 303, and sequentially outputted one line after another in units of block such as shown in FIG. 2. The outputted data is subject to error correction processing at an inner code decoding circuit 307 and an outer code decoding circuit 308, using inner and outer codes. The error-corrected digital video signal is outputted from an output terminal 309.

The above-described digital VTR requires address generators, memories, and the like, which are used for the interleave process only, resulting in an increase of hardware.

Furthermore, the order of data before encoding is different from the order of data on a magnetic tape (on a transmission line). Therefore, a desired data order before error correction code encoding cannot be recorded (transmitted) as it is. In a special reproducing mode of a digital VTR, such as a high speed search which reproduces data while transporting a tape at a speed different from that when recording it, a particular data order is used for allowing effective pixel reproduction. This particular data order of video signals changes if error correction code encoding is performed. It becomes therefore necessary to rearrange the data after error correction code encoding, or to determine a data order while considering such change in advance. In the former case, complicated processing is required, and moreover this processing is carried out with parity bits (words) being affixed so that data amount to be processed becomes bulky and the amount of hardware increases. Also in the latter case, complicated processing is required, a time required for data exchange may become longer, and the amount of hardware increases.

SUMMARY OF THE INVENTION

In consideration of such circumstances, it is an object of the present invention to provide an error correction code encoder and decoder having a high error correction capability without increasing hardware so much.

In order to achieve the above object of the present invention, there is presented an embodiment of an error correction code encoding device, comprising:

(a) first encoding means for generating a first error correction code which is a first parity code added to a first code group having a predetermined number of consecutive information codes of a code sequence; and (b) second encoding means for generating a second error correction code which is a second parity code added to a second code group having information codes each derived from a first group among a plurality of consecutive code groups of the code sequence.

There is also presented an embodiment of an error correction code decoding device, comprising:

(a) first decoding means for decoding a first error correction code which is a first parity code added to a first code group having a predetermined number of consecutive information codes of a code sequence; and (b) second decoding means for decoding a second error correction code which is a second parity code added to a second code group having information codes each derived from a first group among a plurality of consecutive code groups of the code sequence.

The other objects and advantages of the present invention will become more apparent from the following detailed description of the embodiments when read in connection with the accompanying drawings.

BRIEF DESCRIPTION OF THE DRAWINGS

FIG. 7 is a schematic diagram showing the main part of a reproducing system for VTR shown in FIG. 4.

DETAILED DESCRIPTION OF THE PREFERRED EMBODIMENTS

An embodiment of the present invention applied to a digital VTR will be described.

Figure 1:
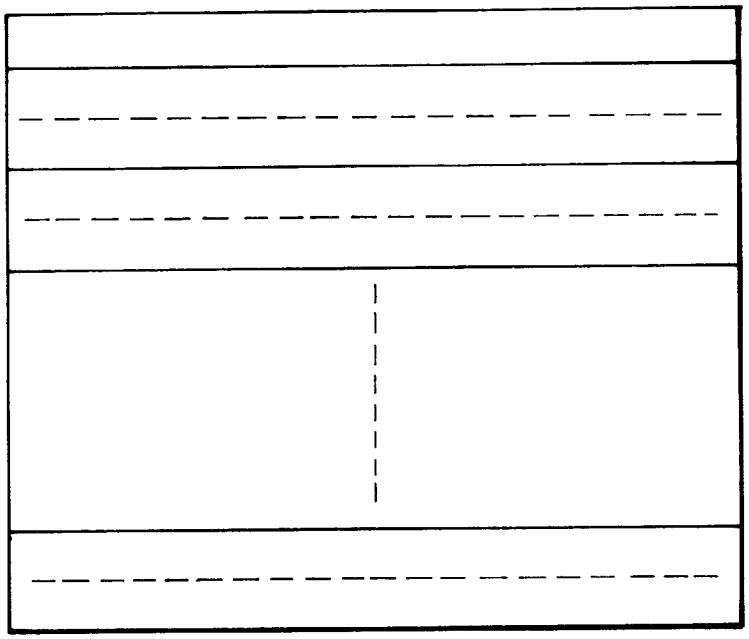
FIG. 1 is a diagram used for explaining a video signal used in a digital VTR.
Figure 2:
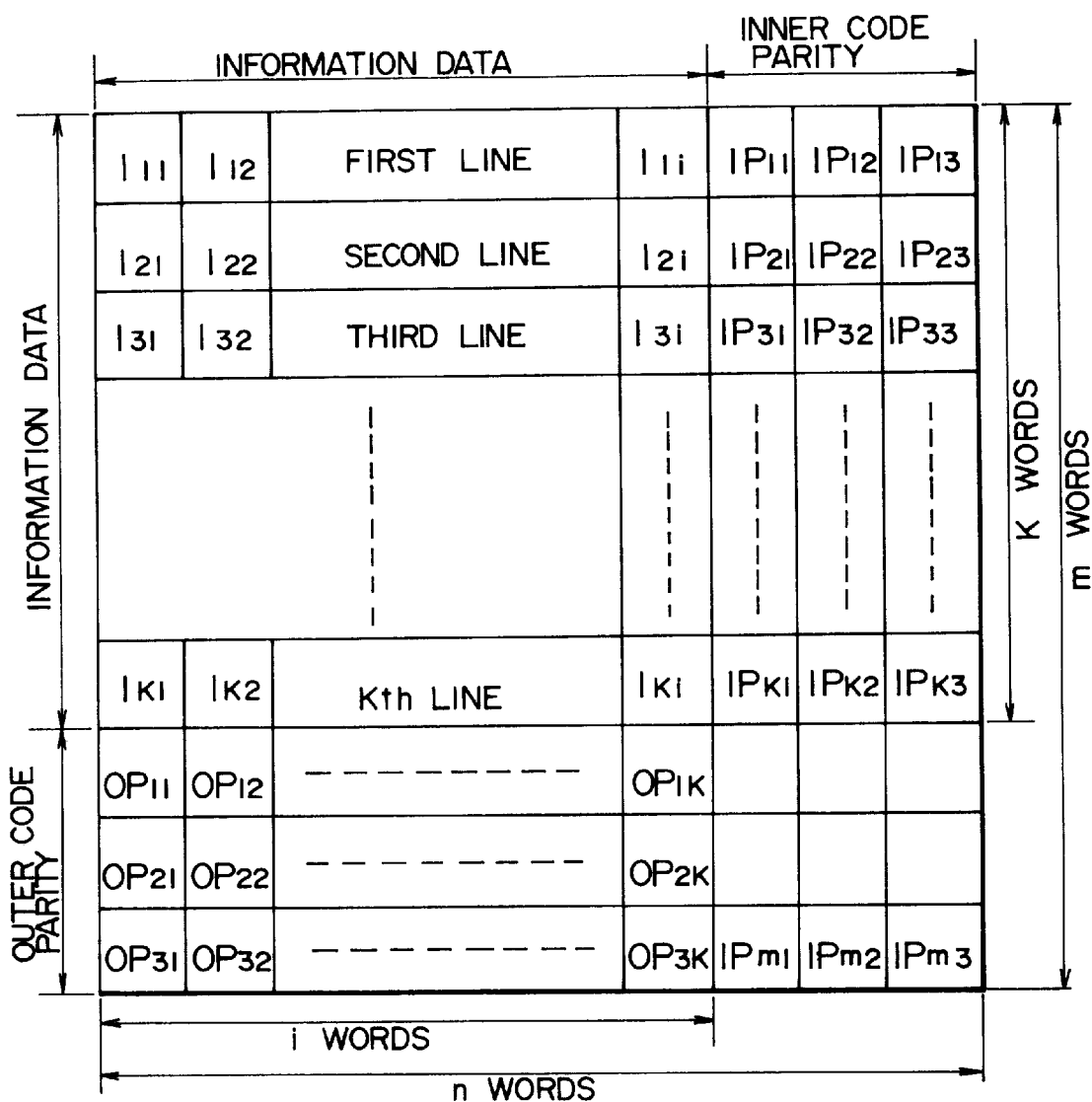
FIG. 2 is a diagram showing error correction code encoded blocks of a conventional digital VTR.
Figure 3:
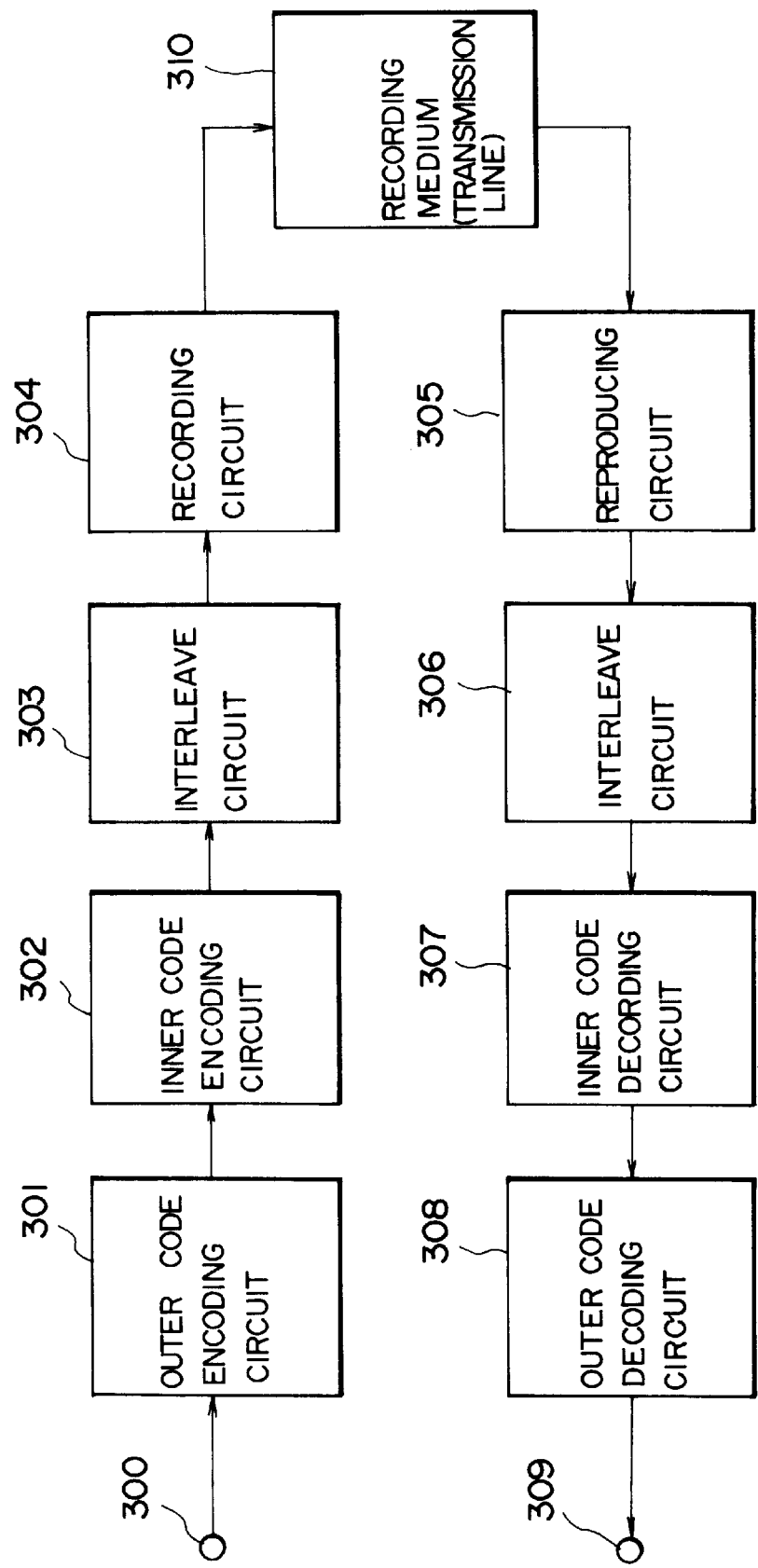
FIG. 3 is a block diagram showing the brief arrangement of a conventional digital VTR.
Figure 4:
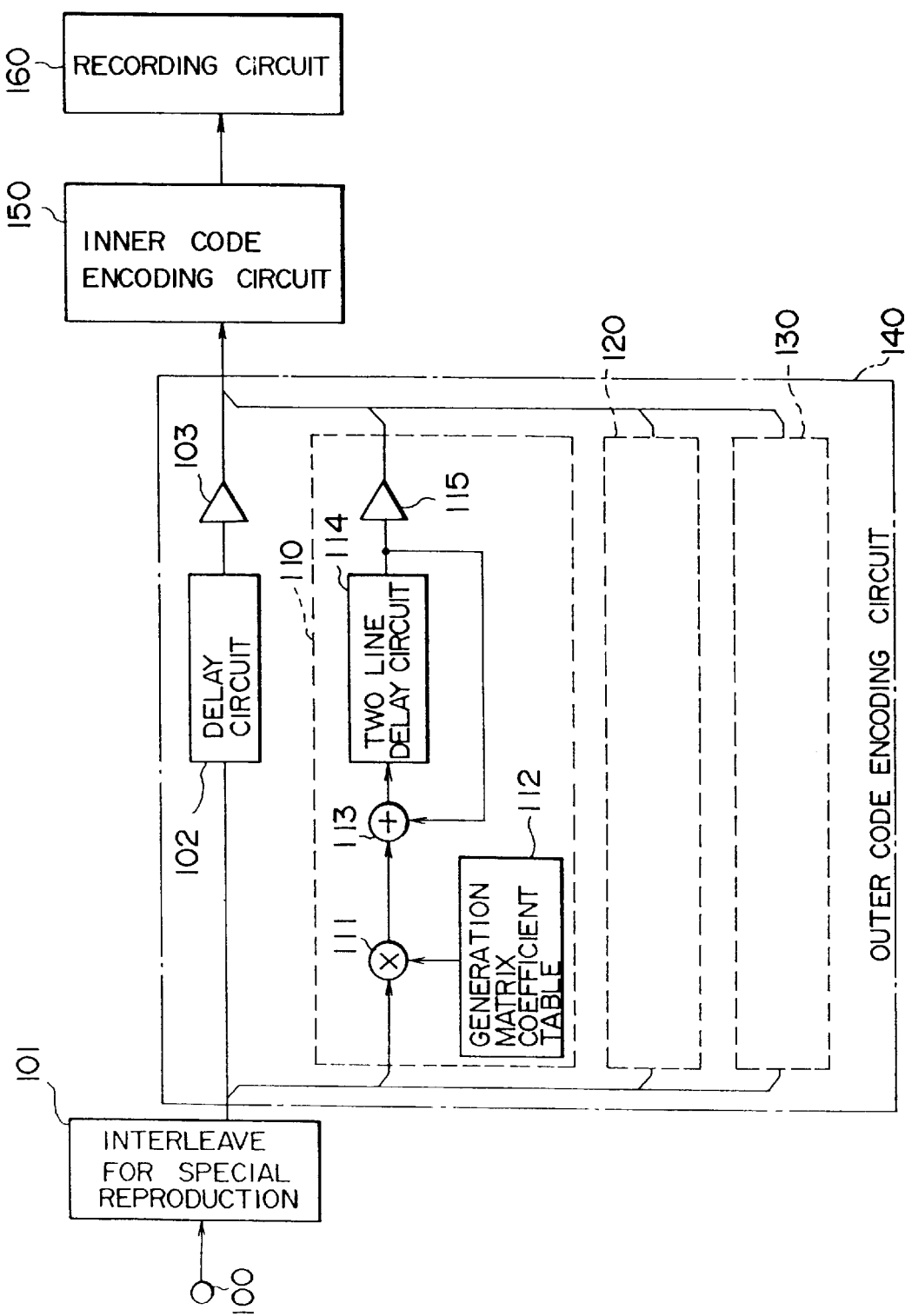
FIG. 4 is a schematic diagram showing the main part of a recording system of a VTR according to an embodiment of the present invention.

FIG. 4 is a schematic diagram briefly showing the main part of a recording system of a digital VTR according to an embodiment of the present invention.

In FIG. 4, reference numeral 100 represents an input terminal for a digital video signal. Like an ordinary television signal, data of each frame, each field, and each line is time sequentially inputted. Reference numeral 101 represents a special reproduction interleave circuit which changes a time sequential inputted digital video signal into a form suitable for a special reproduction such as high speed search. The structure of such a special reproduction interleave circuit can be realized using the teachings given in Japanese Patent Publication No. 63-55541(JP-A-1-228382) and U.S. Ser. No. 317,430 filed on Mar. 1, 1989 (corresponding to JP-A-1-228382). The structure of the circuit is not directly related to the present invention, so the detailed description thereof is omitted. It is assumed in this embodiment that the interleave circuit 101 interleaves data on the line unit basis.

Reference numeral 140 represents an outer code encoding circuit which receives a data train from the special reproduction interleave circuit 101. The data train with outer code parities added by the outer code encoding circuit 140 is inputted to an inner code encoding circuit 150 which further adds inner code parities.

Figure 5:
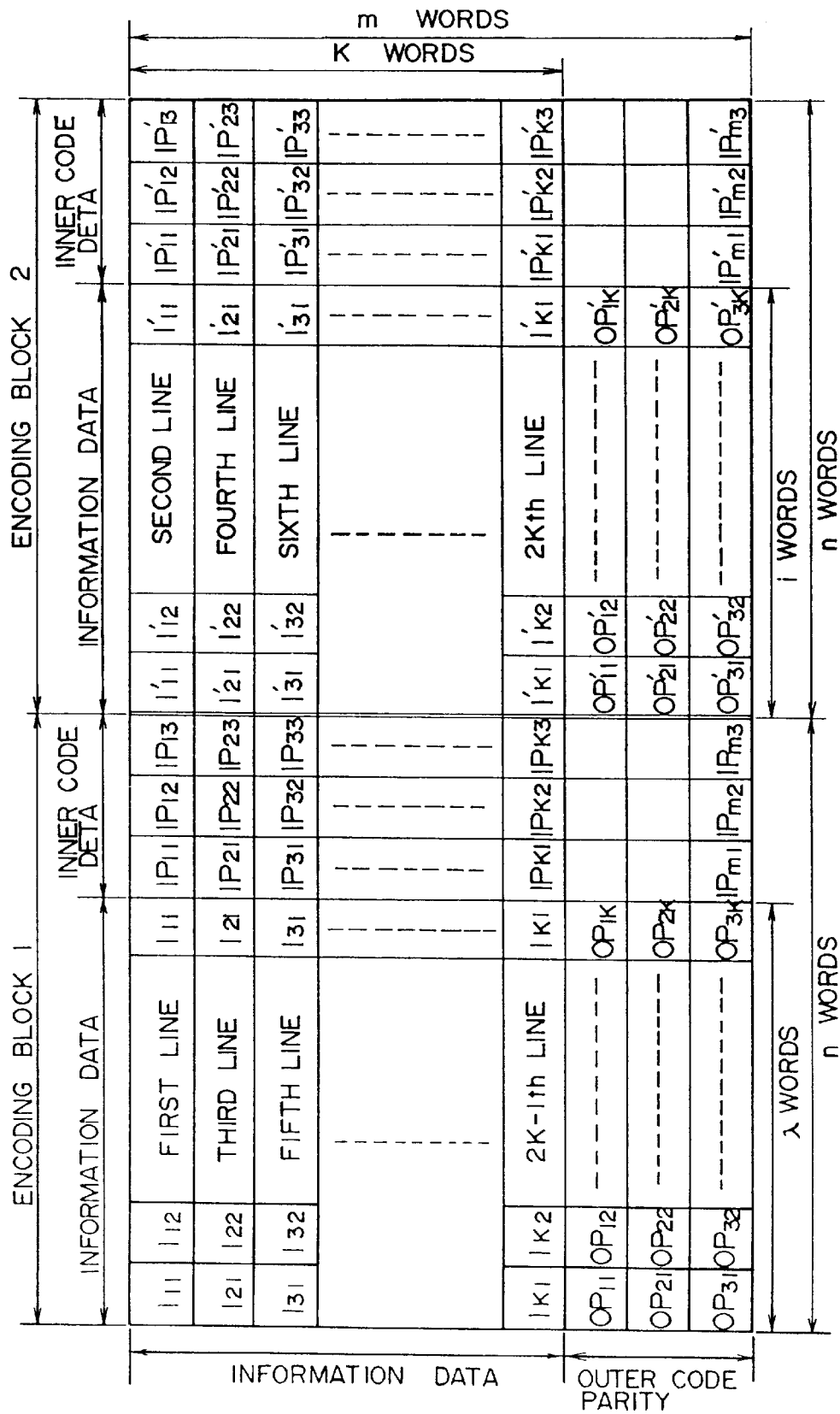
FIG. 5 is a diagram showing the structure of error correction code encoded blocks used for explaining an error correction code encoding method used by VTR shown in FIG. 4.

FIG. 5 is a diagram showing encoded blocks used for explaining the error correction code encoding method used by VTR of this embodiment. Data on the first to $2k$-th lines are sequentially inputted to the outer code encoding circuit 140 in this order. As shown in FIG. 5, it is assumed that three parity words are added as outer codes and as inner codes, respectively, and that each parity word can correct one word at the maximum.

Referring to FIG. 4, the data from the special reproduction interleave circuit 101 is inputted in parallel to a delay circuit 102, P0 parity calculation circuit 110, P1 parity calculation circuit 120, and P2 parity calculation circuit 130.

The structures of the parity calculation circuits 110, 120, and 130 are the same except that coefficients of generation matrix coefficient tables 112 are different. The three parity calculation circuits calculate three parity words.

The operation of the parity calculation circuit will be described using the P0 parity calculation circuit 110 as an example. The information data supplied to the circuit 110 is inputted to a multiplier 111 on a Galois field. The generation matrix coefficient table 112 is constructed of a ROM and an address controller to sequentially output a coefficient of the generation matrix. The multiplier 111 multiplies the information data (word) by a coefficient outputted from the table 112, on a Galois field. An output of the multiplier 111 is supplied to an adder 113 constructed of an exclusive OR gate, and added to an addition result computed two lines perviously and supplied from. a two-line delay circuit 114. The adder 113 and two-line delay circuit 114 constitute an accumulator which accumulates the multiplication results between information words and coefficients at every second line.

The above-described processes are executed for all information words $I_{11}$ to $I_{ki}$ and $I'_{11}$ to $I'_{ki}$, i.e., information words for $2k$ lines. Thus, outer codes different between odd lines and even lines are generated as shown in FIG. 5. outer code parity words P0 ($OP_{11}$ to $OP_{1k}$ shown in FIG. 5) are generated for odd line information codes, and outer code parity words P0 ($OP'_{11}$ to $OP'_{1k}$ shown in FIG. 5) are generated for even line information codes. The generated parity words are stored in the delay circuit 114. Reference numeral 115 represents a buffer.

Similarly, the two-line delay circuits of the P1 and P2 parity calculation circuits 120 and 130 store therein outer code parity words P1 and P2 ($OP_{21}$ to $OP_{2k}$, $OP_{31}$ to $OP_{3k}$ in FIG. 5) for odd line information codes and outer code parity words P1 and P2 ($OP'_{21}$ to $OP'_{2k}$, $OP'_{31}$ to $OP'_{3k}$ in FIG. 5) for even line information codes.

The delay circuit 102 provides the information data with a delay time corresponding to the time required for processing one word by the parity calculation circuit 110, 120, 130, and outputs the information data for the first to $2k$-th lines in the order of having been inputted. The portion where inner code parity words are inserted is made undefined.

After the information data ($2k \times i$ words) of the two sets of blocks shown in FIG. 5 has been outputted, the parity words stored in the two-line delay circuits of the parity calculation circuits 110, 120, and 130 are sequentially outputted via the buffers in the order of P0, P1, and P2 so that outer code parity words for six lines are outputted and added to respective $2k$-lines information codes.

Figure 6:
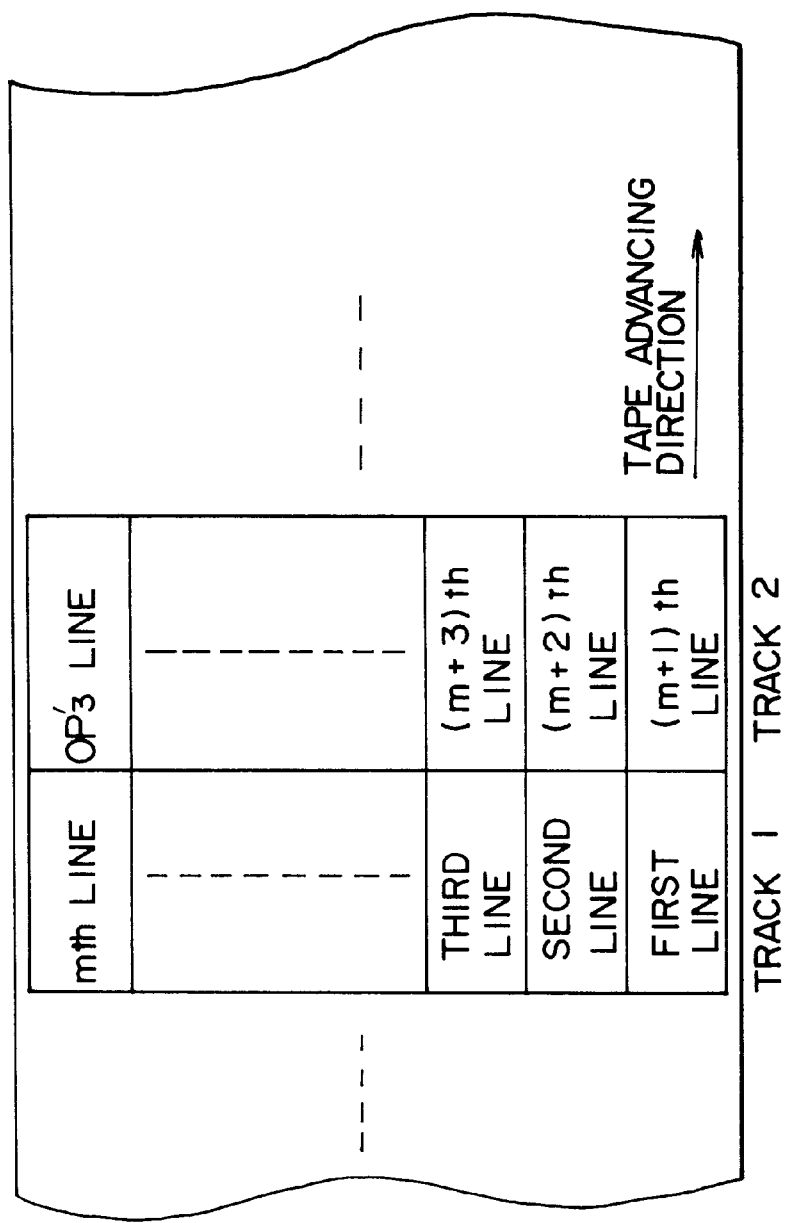
FIG. 6 is a diagram showing a recording state of a tape used by VTR shown in FIG. 4.

An output of the outer code encoding circuit 140 is supplied to an inner code encoding circuit 150 and added with inner code parity words for each line, the inner code parity words being calculated in the well known manner. The information words for 2k lines, 6k outer code parity words, and 6m inner code parity words are supplied to a recording circuit 160 sequentially for each line of the two sets of blocks shown in FIG. 5. These words are distributedly written on two tracks of a magnetic tape as shown in FIG. 6.

With the error correction code encoding described above, even if burst errors of up to two lines are present, each one word error can be corrected by using a corresponding one of the outer codes. This improvement on error correction capability is the same as the conventional case wherein the dedicated interleave circuit 303 is additionally provided. The order of information codes is not changed at all throughout the circuit path from the input stage of the outer code encoding circuit 140 to the input stage of the recording circuit 160. In other words, the effect is achieved without influencing the order of information codes (video data) given by the specific reproduction interleave circuit 101. Thus, it is not necessary to rearrange the order of k information codes after the error correction code encoding. This in turn reduces the hardware necessary for the specific reproduction interleave circuit 101. Various interleave rules can be considered for the specific reproduction interleave circuit 101. In general, data is distributed in line units to a plurality of tracks constituting one frame, and the data of one frame is thinned in units of line and uniformly distributed to each track.

FIG. 7 briefly shows an example of the arrangement of the main part of a reproducing recording system for code trains encoded as described above. Reference numeral 200 represents a reproducing circuit which reproduces code trains recorded on a magnetic tape shown in FIG. 6.

The reproduced code train is supplied to an inner code decoding circuit 250 which calculates a syndrome of one line information words and three parity words so that an error is corrected by inner codes. Then, the code trains, i.e., information words with errors corrected by inner codes and outer code parity words, are supplied in parallel to a delay circuit 201, S0 syndrome calculation circuit 210, S1 syndrome calculation circuit 220, and S2 syndrome calculation circuit 230, one line after another.

The structures of the syndrome calculation circuits 210, 220, and 230 are the same except that coefficients of check matrix coefficient tables 212 are different. The three syndrome calculation circuits calculate three syndromes S0, S1, and S2.

The operation of the syndrome calculation circuit will be described using the S0 syndrome calculation circuit 210 as an example.

The information data supplied to the syndrome calculation circuit 210 is inputted to a multiplier 211 on a Galois field. The check matrix coefficient table 212 is constructed of a ROM and an address controller to sequentially output a coefficient of the check matrix. The multiplier 211 multiplies the inputted word by a coefficient outputted from the table 212, on a Galois field. An output of the multiplier 211 is supplied to an adder 213 constructed of an exclusive OR gate, and added to an addition result before two lines supplied from a two-line delay circuit 214. The adder 213 and two-line delay circuit 214 constitute an accumulator which accumulates the multiplication results between information words, parity words and coefficients at every second line.

The above-described processes are executed for all information words $I_{11}$ to $I_{ki}$ and $I'_{11}$ to $I'_{ki}$ and parity words $OP_{11}$ to $OP_{3k}$, $OP'_{11}$ to $OP'_{3k}$, for two lines. Thus, different syndromes S0 are calculated for odd lines and even lines.

The above-described processes are carried out by the syndrome calculation circuits 210, 220, and 230, so that syndromes S0, S1, and S2 for all outer codes are calculated, which are stored in two-line delay circuits within the circuits 210, 220, and 230.

An error correction circuit 203 corrects errors of the information data supplied from the delay circuit 201 via a buffer 202, by using syndromes S0, S1, and S2 supplied from the syndrome calculation circuits 210, 220, and 230 via buffers 215, in a well known manner. If each outer code can correct one word, consecutive errors within two lines (2n words) generated by the reproducing circuit 200 can be corrected by the outer code decoding circuit 240.

The first to 2k-th line information words are outputted from the outer code decoding circuit 240 in the order of having been reproduced, in the same manner as the conventional method. The order of the outputted information words is rearranged to recover the original order by a specific reproduction de-interleave circuit, 204 which executes an rearrangement opposite to that of the specific reproduction interleave circuit 101, and is then outputted from an output terminal 205.

A VTR having an encoder and decoder described above can improve the burst error correction capability of outer codes by using a different capacity of delay circuits within the encoder and decoder. Error correction is performed within the processes of the encoder and decoder using error correction codes including outer and inner codes. Therefore, the hardware requirements of both the recording system (encoding system) and reproducing system (decoding system) are reduced by dispensing with the dedicated interleave circuit. Furthermore, such processes will not change the order of information code trains, without influencing a specific reproduction interleave.

In the above embodiment, inner codes are disposed in the same direction as the of occurrence of burst errors. Namely, inner codes are added to consecutive information codes of i words (one line), and outer codes are obtained based upon words derived at every second line in the direction different from the first-mentioned direction. Instead, outer codes may be obtained based upon words at each line, and inner codes may be obtained based upon words derived at every second line, with the similar advantageous effects being ensured. In other words, first and second error correction codes may be inner and outer codes, or vice versa.

In the above embodiment, outer codes (second error correction codes) are obtained based upon information words derived at every second line, i.e., information words derived in the vertical direction of the data matrix shown in FIG. 5. Outer codes may be obtained based upon information words derived in the oblique direction of the matrix, i.e., second codes (outer codes) may be obtained based upon information words each derived from 2i consecutively transmitted information words, with the similar advantageous effects being ensured.

Furthermore, in the above embodiment, as shown in FIG. 6, 3k outer code parity words are written concentrated on a magnetic tape at every second track. It is possible to distributively allocate outer code parity words by increasing the capacity of the delay circuits 102 and 201 shown in FIGS. 4 and 7. In this case, in addition to the above-described advantageous effects, errors at the reproducing circuit 200 can be reduced by decreasing the d.c. components of a code train.

As described so far, according to the present invention, it is possible to realize an error correction code encoder and decoder having a high burst error correction capability without increasing the hardware amount to much extent.

What is claimed is:

1. An error correction code coding device for forming an error correction code by adding a check code for error code correction to input information codes, comprising:
    (a) first error correction code encoding means for forming a first error correction code by adding a first check code to each of first code groups sequentially input as a code sequence, the first code groups each having a first number of consecutive information codes; and
    (b) second error correction code encoding means for forming a second error correction code by adding a second check code to each of second groups, said second code groups each having a second number of information codes, each of the second code groups being formed by extracting a predeterminded number of information codes from the first code groups located at positions determined by skipping on a unit basis of N numbers of the first code groups, N being a natural number, said second error correction code encoding means including delay means for delaying a plurality of first code groups.

2. A device according to claim 1, further comprising transmission means for transmitting said information codes encoded by said first and second error correction code encoding means without changing the order of information codes of said code sequence.

3. A device according to claim 1, wherein said information code is video information, and the information amount of said first code group correpsonds to said video information of one horizontal scan line.

4. A device according to claim 1, wherein said first error correction code is an inner code, and said second error correction code is an outer code.

5. An error correction code coding device for forming an error correction code by adding a check code for error code correction to input information codes, comprising:
    (a) first error correction code encoding means for forming a first error correction code by adding a first check code to each of first word groups sequentially inputted as a code sequence, said first word groups each having i consecutive information words, wherein i is an integer greater than or equal to 2; and
    (b) second error correction code encoding means for forming a second error correction code by adding a second check code to each of second code groups, said second code groups each having k information words included in said code sequence, wherein k is an integer greater than or equal to 2, each of the second code groups being formed by extracting a predetermined number of information words from the first word groups located at positions determined by skipping on a unit basis of N number of the first word groups, N being a natural number,
    said second error correction code encoding means generating the second check code by using an accumulator including a multiplier, an adder, and delay means for delaying information words by n number of the i information words, n being an integer greater than 1, said adder adding an output of said multiplier and an output of said delay means and outputting the result of the addition to said delay means.

6. A device according to claim 5, wherein said second error correction code encoding means includes a multiplier for performing multiplication of said information words by a generation matrix, and said accumulator accumulates the result of the multiplication performed by said multiplier.

7. A device according to claim 5, wherein said first error correction code is an inner code, and said second error correction code is an outer code.

8. An error correction code decoding device for inputting an error correction code formed by adding a check code for correction of an error code of an information word, to the successive information words and decoding the error correction code, comprising:
    (a) first error correction code decoding means for decoding a first error correction code formed by adding a first check code to each of first word groups sequentially inputted as a code sequence, said first word groups each having i consecutive information words, wherein i is an integer greater than or equal to 2; and
    (b) second error correction code decoding means for decoding a second error correction code formed by adding a second check code to each of second word groups, said second word groups each having k information words included in said code sequence, wherein k is an integer greater than or equal to 2, each of the second code groups being formed by extracting a predetermined number of information words from the first word groups located at positions determined by skipping on a unit basis of N number of the first word groups, N being a natural number, said second error correction code decoding means including delay means for delaying a plurality of first word groups.

9. A device according to claim 8, further comprising reception means for receiving said code sequence having said information words added with said first and second check codes from a transmission line, and supplying said code sequence to said first or second decoding means without changing the order of said information words of said code sequence.

10. A device according to claim 8, wherein said information word is video information, and the information amount of said first word group corresponds to said video information of one horizontal scan line.

11. A device according to claim 8, wherein said second error correction decoding means includes a multiplier for performing multiplication of said information words by a generation matrix, and an accumulator accumulates the result of the multiplication performed by said multiplier, and wherein said second error correction code decoding means corrects the error code of said information words based on the output from said accumulator.

12. An error correction code decoding device for inputting an error correction code formed by adding a check code for correction of an error code of an information word, to the successive information words and decoding the error correction code, comprising:
    (a) first error correction code decoding means for decoding a first error correction code formed by adding a first check code to each of first code groups sequentially inputted as a code sequence, the first code groups having a first number of consecutive information codes; and
    (b) second error correction code decoding means for decoding a second error correction code formed by adding a second check code to each of second code groups, the second code groups each having a second number of information codes included in said code sequence, each of the second code groups being formed by extracting a predetermined number of information codes from the first code groups located at positions determined by skipping on a unit basis of M number of first code groups, M being a natural number, wherein said second error correction code decoding means includes a multiplier for performing multiplication of said information codes by a generation matrix, and an accumulator including an adder and delay means for delaying information codes by N number of the first number of information codes, N being an integer greater than 1, said adder adding an output of said multiplier and an output of said delay means and outputting the result of the addition to said delay means.

13. An error correction code coding method for forming an error correction code by adding a check code for error code correction to input information codes, comprising the steps of:

(a) forming a first error correction code by adding a first check code to each of first code groups sequentially input as a code sequence, the first code groups each having a first number of consecutive information codes; and (b) forming a second error correction code by adding a second check code to each of second code groups, said second code groups each having a second number of information codes, each of the second code groups being formed by extracting a predetermined number of information codes from the first code groups located at positions determined by skipping on a unit basis of N number of the first code groups, N being a natural number, said second error correction code forming step including a step of delaying a plurality of first code groups.

14. An error correction code decoding method for inputting an error correction code formed by adding a check code for correction of an error code of an information word, to successive information words and decoding the error correction code, comprising the steps of:

(a) decoding a first error correction code formed by adding a first check code to each of first code groups sequentially inputted as a code sequence, said first code groups having a first number of consecutive information codes; and (b) decoding a second error correction code formed by adding the second check code to each of second code groups, said second code groups each having a second number of information codes included in said code sequence, wherein each of the second code groups is formed by extracting a predetermined number of information codes from the first code groups located at positions determined by skipping on a unit basis of M number of first code groups, M being a natural number, and wherein said second error correction code decoding step includes a multiplying step for performing multiplication of said information codes by a generation matrix, and an accumulation step including an addition step and a delay step of delaying information codes by N number of the first number of information codes, N being an integer greater than 1, and wherein said addition step adds an output of said multiplying step and an output of said delay step and outputs the result of the addition into the delay step.

15. An error correction code coding method of forming an error correction code by adding a check code for error code correction to input information codes, comprising the steps of:

(a) forming a first error correction code by adding a first check code to each of first word groups sequentially inputted as a code sequence, said first word groups each having i consecutive information words, wherein i is an integer greater than or equal to 2; and (b) forming a second error correction code by adding a second check code to each of second code groups, said second code groups each having k information words included in said code sequence, wherein k is an integer greater than or equal to 2, each of the second code groups being formed by extracting a predetermined number of information words from the first word groups located at positions determined by skipping on a unit basis of N number of the first word groups, N being a natural number, wherein said second error correction code forming step generates the second check code by using an accumulating step including a multiplying step, an adding step, and a delay step of delaying information words by n number of i information words, n being an integer greater than 1, and wherein said adding step adds an output of said multiplying step and an output of said delay step and supplies the result of the addition to said delay step.

16. An error correction code decoding method of inputting an error correction code formed by adding a check code for correction of an error code of an information word to the successive information words, and decoding the error correction code, comprising the steps of:

(a) decoding a first error correction code formed by adding a first check code to each of first word groups sequentially inputted as a code sequence, said first word groups each having i consecutive information words, wherein i is an integer greater than or equal to 2; and (b) decoding a second error correction code formed by adding a second check code to each of second word groups, said second word groups each having k information words included in said code sequence, wherein k is an integer greater than or equal to 2, each of the second code groups being formed by extracting a predetermined number of information words from the first word groups located at positions determined by skipping on a unit basis of M number of the first word groups, N being a natural number and said second error correction code decoding step including a delay step of delaying a plurality of first word groups.

* * * * *

UNITED STATES PATENT AND TRADEMARK OFFICE
CERTIFICATE OF CORRECTION

PATENT NO. : 6,085,348
DATED : July 4, 2000
INVENTOR(S) : Tetsuya Shimizu

It is certified that error appears in the above-identified patent and that said Letters Patent is hereby corrected as shown below:

Column 1,
Line 4, "continuation," shoud read -- continuation --.
Line 41, "such as" should be deleted.

Column 4,
Line 30, "perviously" should read -- previously --; and "from." should read -- from --.

Column 6,
Line 21, "an" should read -- a --.

Signed and Sealed this

Tenth Day of February, 2004

JON W. DUDAS
*Acting Director of the United States Patent and Trademark Office*